(12) United States Patent
Charlier et al.

(10) Patent No.: US 8,466,072 B2
(45) Date of Patent: Jun. 18, 2013

(54) PROCESS OF LOCALIZED ELECTROGRAFTING ONTO PHOTOSENSITIVE SEMICONDUCTOR SUBSTRATES

(75) Inventors: Julienne Charlier, Gif sur Yvette (FR); Serge Palacin, Montigny le Bretonneux (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 532 days.

(21) Appl. No.: 12/678,993

(22) PCT Filed: Sep. 18, 2008

(86) PCT No.: PCT/EP2008/062438
§ 371 (c)(1),
(2), (4) Date: Mar. 18, 2010

(87) PCT Pub. No.: WO2009/037311
PCT Pub. Date: Mar. 26, 2009

(65) Prior Publication Data
US 2011/0281441 A1    Nov. 17, 2011

(30) Foreign Application Priority Data
Sep. 20, 2007   (FR) ..................................... 07 57723

(51) Int. Cl.
*H01L 21/31*        (2006.01)
*H01L 21/469*       (2006.01)
(52) U.S. Cl.
USPC ................................... 438/780; 257/E21.259

(58) Field of Classification Search
USPC ................................... 438/780; 257/E21.259
See application file for complete search history.

(56) References Cited

U.S. PATENT DOCUMENTS

| | | |
|---|---|---|
| 2004/0248428 A1 | 12/2004 | Bureau et al. |
| 2005/0031887 A1 | 2/2005 | Finestone et al. |
| 2007/0281148 A1 | 12/2007 | Bureau et al. |
| 2008/0124832 A1 | 5/2008 | Deniau et al. |

FOREIGN PATENT DOCUMENTS

| | | |
|---|---|---|
| FR | 03 11491 | 4/2005 |
| FR | 05 02516 | 9/2006 |
| WO | WO 03/018212 A1 | 3/2003 |
| WO | WO 2007/099137 A2 | 9/2007 |

OTHER PUBLICATIONS

Morgenstern et al., "Laser-Assisted Microstructuring and Characterization of Polybithiophene," Sensors and Actuators A, vol. 51, pp. 103-107, 1995.

(Continued)

*Primary Examiner* — Stephen W Smoot
*Assistant Examiner* — Vicki B Booker
(74) *Attorney, Agent, or Firm* — Miles & Stockbridge P.C.

(57) ABSTRACT

A process for preparing an organic film on a selected zone at the surface of a photosensitive semiconductor substrate, including (i) bringing a liquid solution which includes at least one organic adhesion primer into contact with at least the selected zone; (ii) polarizing the surface of the substrate to an electric potential more cathodic than the reduction potential of the organic adhesion primer; and (iii) exposing the selected zone to light radiation, the energy of which is at least equal to that of the band gap of the photosensitive semiconductor substrate.

32 Claims, 1 Drawing Sheet

OTHER PUBLICATIONS

Belanger et al., "Direct Modification of a Gold Electrode with Aminophenyl Groups by Electrochemical Reduction of in Situ Generated Aminophenyl Monodiazonium Cations," Chemical Material, vol. 18, pp. 4755-4763, 2006.

Deniau et al., "Surface Electroinitiated Emulsion Polymerization: Grafted Organic Coatings from Aqueous Solutions," Chemical Material, vol. 18, pp. 5421-5428, 2006.

X.G. Zhang, "Basic Theories of Semiconductor Electrochemistry," pp. 1-43 in Electrochemistry of Silicon and its Oxide, Kluwer Academic/Plenum Publishers, 2001.

L.I. Berger, "Properties of Semiconductors," pp. 12-80 to 12-92 in CRC Handbook of Chemistry and Physics, ed. David R. Lide, CRC Press, Boca Raton, 2006.

Asami et al., "Development of a Novel Environmentally Friendly Electropolymerization of Water-Insoluble Monomers in Aqueous Electrolytes Using Acoustic Emulsification," Langmuir, vol. 22, pp. 10258-10263, 2006.

Gal et al., "Band Gap Determination of Semiconductor Powders Via Surface Photovoltage Spectroscopy," Journal of Applied Physics, vol. 86, pp. 5573-5577, Nov. 1999.

PROCESS OF LOCALIZED ELECTROGRAFTING ONTO PHOTOSENSITIVE SEMICONDUCTOR SUBSTRATES

CROSS-REFERENCES TO RELATED APPLICATIONS

This application is a National Stage application of PCT/EP08/62438 filed on Sep. 18, 2008; and claims Foreign Priority benefit of FRANCE 0757723 filed Sep. 20, 2007.

TECHNICAL FIELD

The present invention relates to the field of organic surface coatings, the said coatings being in the form of organic films. It relates more particularly to the use of solutions suitably selected in order to make possible the simple and reproducible formation of organic films by selective coating onto electrically semiconductive surfaces and particularly by electrografting. The present invention also relates to a process for preparing said organic coatings.

PRIOR ART

There currently exists several techniques which make it possible to prepare thin organic films on substrates, each being based on an appropriate family or class of molecules.

The process for forming a coating by centrifuging, or "spin coating" does not require a particular affinity between the molecules deposited and the substrate of interest, which is also the case for the related techniques for forming coatings by immersion (dip coating) or by deposition by spraying (spray coating). This is because the cohesion of the deposited film is based essentially on the interactions between the constituents of the film, which can, for example, be crosslinked after deposition in order to improve the stability thereof. These techniques are highly versatile, can be applied to all types of surfaces to be covered and are highly reproducible. However, they do not make possible any effective grafting between the film and the substrate (simple physisorption is involved). The thicknesses produced are difficult to control, especially for the finest depositions (less than 20 nanometres) and rarely uniform over the entire surface.

Other techniques for forming an organic coating at the surface of a support, such as plasma deposition or else photochemical activation, are based on the same principle: generating unstable forms of a precursor close to the surface to be covered, which unstable forms change with the formation of a film on the substrate. While plasma deposition does not require any specific property of its precursors, photoactivation for its part requires the use of photosensitive precursors, the structure of which changes under irradiation with light. These techniques generally give rise to the formation of adherent films, although it is generally impossible to discern whether this adhesion is due to crosslinking of a film topologically closed around the object or to true formation of bonds at the interface.

The self-assembling of monolayers (SAM for "self-assembled monolayers") is a technique which is very simple to employ which requires, however, the use of generally molecular precursors having a sufficient affinity for the surface of interest to be coated. The term used will then be "precursor-surface pair", such as sulphur compounds having affinity for gold or silver, trihalosilanes for oxides, such as silica or alumina, or polyaromatics for graphite or carbon nanotubes. In all cases, the formation of the film is based on a specific chemical reaction between a part of the precursor molecule (the sulphur atom in the case of the thiols, for example) and certain "receptor" sites of the surface. A chemisorption reaction provides the attachment. However, while the pairs involving oxide surfaces may give rise to the formation of very firmly grafted films (the Si—O bond involved in the chemisorption of trihalosilanes on silica is among the most stable in chemistry), this is not at all the case when oxide-free metals or semiconductors are involved.

Anodic electropolymerization consists of the polymerization of monomer species in the presence of electrons close to an electrically conductive or semiconductive surface. The polymerization results in the formation of a film by precipitation in the vicinity of the surface. However, no bond of covalent nature is created between the surface and the polymer, which results in the films obtained not having an optimal resistance to attacks. Among the monomers that can be used according to this technique, mention may especially be made of pyrrole.

The electrografting of polymers is a technique based on the initiation and then the polymerization, by chain propagation, which is electroinduced of electroactive monomers on the surface of interest, which acts both as electrode and as polymerization initiator. It requires the use of precursors suited to its mechanism of initiation by reduction and of propagation, generally anionic, as preference is often given to cathodically initiated electrografting, which can be applied to noble and non-noble metals. Electrografting by anodic polarization can, for its part, be applied only to noble or carbon-based substrates: graphite, glassy carbon, boron-doped diamond. International application WO 03/018212 describes, in particular, a process for grafting and growing a conductive organic film on an electrically conductive surface, the grafting and growing being carried out simultaneously by electro-reduction of a diazonium salt that is a precursor of said organic film.

Among the various techniques recalled above, electrografting is the only technique which makes it possible to produce grafted films with specific control of the interfacial bonding.

Recent technological developments, linked to the race for miniaturization, have led to the emergence of further improved coating processes that make it possible to specifically localize the organic film on a surface.

Therefore, with reference to what has been explained above, mention may especially be made of the studies which have been carried out on thin organic films by photolithography. This technique is principally based on the application of light radiation to a portion of the surface covered with the monolayer. Depending on the methods of implementation, the process may result in a modification of the monolayer in a localized manner or in its localized disappearance by photocatalysis on the chemical bonds.

Electropolymerization (Morgenstern et al., "Laser-assisted microstructuring and characterization of polythiophene", Sensors and Actuators A. 1995, Vol. 51, p. 103-107) allows, via the application of localized light radiation, the deposition of semiconductive organic polymers, such as polythiophene, in a precise manner to n-doped silicon surfaces. These depositions do not however have defined interface bonds with their substrate.

For all their relevance, the techniques, the most improved of the localized film coating methods, do not make it possible to form organic films that are effectively bonded to the surfaces. Moreover, to date, no significant improvement has been made to electrografting in this field.

SUMMARY OF THE INVENTION

The present invention makes it possible to solve the drawbacks of the processes and of the coatings of the prior art and corresponds, in particular, to a process for the localized grafting of an organic film to the surface of a photosensitive semiconductor substrate in the presence of an electrolytic solution containing an organic adhesion primer and via application of an electric potential to the substrate. The grafting is carried out selectively on at least one portion of the surface exposed to light radiation.

More specifically, the invention corresponds to a process for preparing an organic film on a selected zone at the surface of a photosensitive semiconductor substrate, characterized in that it comprises the following steps:

i) bringing a liquid solution comprising at least one organic adhesion primer into contact with at least said selected zone;

ii) polarization of the surface of said substrate to an electric potential more cathodic than the reduction potential of the adhesion primer used in step (i); and iii) exposure of said selected zone to light radiation, the energy of which is at least equal to that of the band gap of said semiconductor.

Within the context of the present invention, the term "semiconductor" is understood to mean an organic or inorganic material that has an electrical conductivity intermediate between metals and insulators. The conductivity properties of a semiconductor are mainly influenced by the charge carriers (electrons or holes) that the semiconductor has. These properties are determined by two particular energy bands known as the valence band (corresponding to the electrons involved in covalent bonds) and the conduction band (corresponding to electrons in an excited state and that are capable of moving within the semiconductor). The "band gap" represents the energy difference between the valence band and the conduction band. A semiconductor also corresponds, unlike insulators or metals, to a material for which the electrical conductivity can be controlled, to a large extent, by addition of dopants which correspond to foreign elements inserted into the crystal structure of the semiconductor.

Within the context of the present invention, the expression "a photosensitive semiconductor" is understood to mean a semiconductor material, the conductivity of which may be adjusted by variations in magnetic field, in temperature or in illumination, which influence the electron-hole pairs and the density of the charge carriers. These properties are due to the existence of the band gap as defined previously. This band gap generally does not exceed 3.5 eV for semiconductors, versus 5 eV in materials considered to be insulators. It is therefore possible to populate the conduction band via excitation of the carriers across the band gap, especially under illumination. The elements from group IV of the Periodic Table, such as carbon (in diamond form), silicon, and germanium exhibit such properties. Semiconductor materials may be formed from several elements, both from group IV, such as SiGe or SiC, and from group III and V, such as GaAs, InP or GaN, or else from group II and VI, such as CdTe or ZnSe.

Advantageously, within the context of the present invention, the photosensitive semiconductor substrate is of inorganic nature. Thus, the photosensitive semiconductor used within the context of the present invention is chosen from the group constituted by the elements from group IV (more particularly, silicon and germanium); the alloys of elements from group IV (more particularly, the alloys SiGe and SiC); the alloys of elements from group III and from group V (known as "III-V" compounds, such as AsGa, InP, GaN) and the alloys of elements from group II and group VI (known as "II-VI" compounds, such as CdSe, CdTe, $Cu_2S$, ZnS or ZnSe). The preferred photosensitive semiconductor is silicon.

In one variant of the present invention, it is possible for the photosensitive semiconductor to be doped with one (or more) dopant(s). The dopant is chosen as a function of the semiconductor, and the doping is of p or n type. The choice of the dopant and the doping technologies are routine techniques for the one skilled in the art. More particularly, the dopant is chosen from the group consisting in boron, nitrogen, phosphorus, nickel, sulphur, antimony, arsenic and mixtures thereof. As examples, for a silicon substrate, among the most widely used p-type dopants, mention may especially be made of boron and, for the n-type dopants, arsenic, phosphorus and antimony.

In another variant, the semiconductor substrate is placed in contact with and may be partly covered by a conductive material. When the semiconductor substrate is partly covered with a conductive material, the portion of the surface covered is not, preferably, in contact with the liquid solution. The portion of the substrate in contact with the conductive material may, for example, be located close to the selected zone. It is advantageous for the selected zone to be flat. In this case, the selected zone and the portion covered with conductive material may especially be located on surfaces that are substantially parallel to the substrate. Preferably, the portion covered with material is located on the rear face of the substrate, the "front" face of the substrate corresponding to the face on which the selected zone is located. The conductive material will be able to be used for applying an electric potential to the photosensitive semiconductor substrate of interest. Any conductive material known by the one skilled in the art can be used within the context of the present invention. However, the conductive material is generally a metal such as gold.

The expression "adhesion primer" corresponds, within the context of the present invention, to any organic molecule capable, under certain conditions, of being chemisorbed onto the surface of a solid support via a radical reaction, and especially by electrografting, and comprising a functional group that is reactive with respect to another radical after chemisorption.

The adhesion primer is advantageously a cleavable aryl salt chosen from the group consisting in aryldiazonium salts, arylammonium salts, arylphosphonium salts and arylsulphonium salts. In these salts, the aryl group is an aryl group which may be represented by R as defined below.

Among the cleavable aryl salts, mention may in particular be made of the compounds of formula (I) below:

$$R\text{—}N_2^+, A^- \qquad (I)$$

in which:

A represents a monovalent anion; and

R represents an aryl group.

As the aryl group of the cleavable aryl salts and especially of the compounds of formula (I) above, mention may advantageously be made of the optionally monosubstituted or polysubstituted, aromatic or heteroaromatic carbon-based structures constituted of one or more aromatic or heteroaromatic rings each comprising from 3 to 8 atoms, the heteroatom(s) possibly being N, O, P or S. The substituent(s) may contain one or more heteroatoms, such as N, O, F, Cl, P, Si, Br or S and also in particular $C_1$ to $C_6$ alkyl groups.

Among the cleavable aryl salts and especially compounds of formula (I) above, R is preferably chosen from aryl groups substituted by electron-withdrawing groups such as $NO_2$, COH, ketones, CN, $CO_2H$, $NH_2$, esters and halogens. The R groups of aryl type that are particularly preferred are nitrophenyl and phenyl radicals.

Among the compounds of formula (I) above, A may especially be chosen from inorganic anions such as halides, for instance I⁻, Br⁻ and Cl⁻, haloborates such as tetrafluoroborate, and organic anions such as alcoholates, carboxylates, perchlorates and sulphonates.

As compounds of formula (I), it is particularly advantageous to use a compound chosen from the group consisting in phenyldiazonium tetrafluoroborate, 4-nitrophenyldiazonium tetrafluoroborate, 4-bromophenyldiazonium tetrafluoroborate, 4-aminophenyldiazonium chloride, 2-methyl-4-chlorophenyldiazonium chloride, 4-benzoylbenzenediazonium tetra-fluoroborate, 4-cyanophenyldiazonium tetrafluoroborate, 4-carboxyphenyldiazonium tetrafluoroborate, 4-acetamidophenyldiazonium tetrafluoroborate, 4-phenyl-acetic acid diazonium tetrafluoroborate, 2-methyl-4-[(2-methylphenyl)diazenyl]benzenediazonium sulphate, 9,10-dioxo-9,10-dihydro-1-anthracenediazonium chloride, 4-nitronaphthalenediazonium tetrafluoroborate and naphthalenediazonium tetrafluoroborate.

The concentration of primer in the solution is variable and depends on what the experimenter wants. It is however recommended to work at a concentration for which the primer is completely soluble in the liquid solution. Thus, for example, for aryldiazonium salts, the concentration will typically be between $10^{-3}$ and $5 \times 10^{-2}$ M.

Advantageously, in the case where the adhesion primer is an aryldiazonium salt, the pH of the solution is less than 7, typically less than or equal to 3. It is recommended to work at a pH between 0 and 3. If necessary, the pH of the solution may be adjusted to the desired value using one or more acidifying agents that are well known by the one skilled in the art, for example using mineral or organic acids such as hydrochloric acid or sulphuric acid.

The adhesion primer may either be introduced as is into the liquid solution as defined previously, or be prepared in situ in the latter. Thus, in one particular embodiment, the process according to the present invention comprises a step of preparing the adhesion primer, especially when the latter is an aryldiazonium salt. Such compounds are generally prepared from an arylamine, which may comprise several amine substituents, by reaction with $NaNO_2$ in an acid medium. For a detailed explanation of the experimental methods that can be used for such an in situ preparation, a person skilled in the art could refer to the open literature [D. Belanger et al. (2006) Chem. Mater. Vol. 18; 4755-4763]. Preferably, the grafting will then be carried out directly in the solution for preparation of the aryldiazonium salt.

The liquid solution containing at least one adhesion primer used within the context of the present invention may also contain at least one radical-polymerizable monomer different from said adhesion primer.

The radical-polymerizable monomers used within the context of the present invention correspond to monomers capable of polymerizing under radical conditions after initiation by a radical chemical entity. Typically, these are molecules comprising at least one bond of ethylenic type. Vinyl monomers, especially the monomers described in patent application FR 05/02516 and also in patent FR 03/11491, are particularly relevant.

According to one particularly advantageous embodiment of the invention, the vinyl monomer(s) is (are) chosen from the monomers of formula (II) below:

in which the $R_1$ to $R_4$ groups, which are identical or different, represent a non-metallic monovalent atom such as a halogen atom, a hydrogen atom, a saturated or unsaturated chemical group, such as an alkyl or aryl group, a —$COOR_5$ group in which $R_5$ represents a hydrogen atom or a $C_1$-$C_{12}$, preferably $C_1$-$C_6$, alkyl group, a nitrile, a carbonyl, an amine or an amide.

The compounds of formula (II) above are chosen, in particular, from the group consisting in vinyl acetate, acrylonitrile, methacrylonitrile, methyl methacrylate, ethyl methacrylate, butyl methacrylate, propyl methacrylate, hydroxyethyl methacrylate, hydroxypropyl methacrylate, glycidyl methacrylate and derivatives thereof; acrylamides and especially amino-ethyl, propyl, butyl, pentyl and hexyl methacrylamides, cyanoacrylates, diacrylates and dimethacrylates, triacrylates and trimethacrylates, tetraacrylates and tetramethacrylates (such as pentaerythritol tetra-methacrylate), styrene and its derivatives, para-chlorostyrene, pentafluorostyrene, N-vinylpyrrolidone, 4-vinylpyridine, 2-vinylpyridine, vinyl, acryloyl or methacryloyl halides, divinylbenzene (DVB), and more generally vinyl crosslinking agents or crosslinking agents based on acrylate, methacrylate, and derivatives thereof.

According to one particular embodiment, the monomers used are those which, a contrario compounds soluble at any proportion in the liquid solution in question, are soluble up to a certain proportion in the solution, i.e. the value of their solubility in this solution is finite. The monomers that can be used in accordance with the process of the invention may thus be chosen from the compounds whose solubility in the liquid solution is finite and more particularly below 0.1 M, more preferably between $5 \times 10^{-2}$ and $10^{-6}$ M. Among such monomers, mention may, for example, be made of butyl methacrylate, the solubility of which, measured under normal temperature and pressure conditions, is around $4 \times 10^{-2}$ M. According to the invention, and unless otherwise indicated, the normal pressure and temperature conditions (NTPC) correspond to a temperature of 25° C. and to a pressure of $1 \times 10^5$ Pa.

The invention also applies to a mixture of two, three, four or more monomers chosen from the monomers described previously.

The amount of radical-polymerizable monomers in the liquid solution may vary depending on what the experimenter wants. This amount may be greater than the solubility of the monomer in question in the liquid solution used and may represent, for example, from 18 to 40 times the solubility of said monomer in the liquid solution at a given temperature, generally ambient temperature or the reaction temperature. Under these conditions, it is advantageous to use means enabling the dispersion of the monomer molecules in the liquid solution such as a surfactant or ultrasound waves.

According to one particular embodiment of the invention, it is recommended to add a surfactant when the monomer has a solubility of less than $5 \times 10^{-2}$ M. A precise description of the surfactants that can be used within the context of the invention is given in the literature (Deniau et al., Chem. Mater. 2006, 18, 5421-5428) to which the one skilled in the art will be able to refer. A single surfactant or a mixture of several surfactants may be used. The amount of surfactant(s) necessary is variable; it must especially be sufficient to allow the formation of the organic film. The minimum amount of surfactant(s) may be easily determined by sampling solutions having an identical composition but a variable concentration of surfactant(s). Generally, the concentration of surfactant(s) is such that the critical micelle concentration (CMC) is achieved and such that there can thus be formation of micelles. The CMC of a surfactant may be determined by methods known to the one skilled in the art, for example by surface tension measurements. Typically, the surfactant concentration will be between 0.5 mM and 5 M approximately, preferably between 0.1 mM and 150 mM approximately. The recommended surfactant concentration is usually 10 mM.

Surfactants are molecules that have a lipophilic (apolar) part and a hydrophilic (polar) part. Among the surfactants that can be used according to the invention, mention may especially be made of:

i) anionic surfactants, the hydrophilic part of which is negatively charged; preferably the surfactant will be an alkyl or aryl sulphonate, sulphate, phosphate or sulphosuccinate combined with a counterion such as an ammonium ion ($NH_4^+$), a quaternary ammonium such as tetrabutylammonium, and alkali metal cations such as $Na^+$, $Li^+$ and $K^+$;

ii) cationic surfactants, the hydrophilic part of which is positively charged; they are preferably chosen from quaternary ammoniums comprising at least one $C_4$-$C_{22}$ aliphatic chain combined with an anionic counterion chosen, in particular, from boron derivatives such as tetrafluoroborate or halide ions such as $F^-$, $Br^-$, $I^-$ or $Cl^-$;

iii) zwitterionic surfactants, which are neutral compounds having formal unit electrical charges of opposite sign; they are preferably chosen from compounds having a $C_5$-$C_{20}$ alkyl chain generally substituted by a negatively charged functional group such as a sulphate or a carboxylate and a positively charged functional group such as an ammonium;

iv) amphoteric surfactants which are compounds that behave both as an acid or as a base depending on the medium in which they are placed; these compounds may have a zwitterionic nature, amino acids are one particular example of this family;

v) neutral (i.e. non-ionic) surfactants: the surfactant properties, especially hydrophilicity, are provided by uncharged functional groups such as an alcohol, an ether, an ester or else an amide, containing heteroatoms such as nitrogen or oxygen; due to the low hydrophilic contribution of these functional groups, non-ionic surfactant compounds are usually polyfunctional.

The charged surfactants may of course bear several charges.

As an anionic surfactant, it is, for example, possible to use tetraethylammonium para-toluenesulphonate, sodium dodecylsulphate, sodium palmitate, sodium stearate, sodium myristate, sodium di(2-ethylhexyl)sulphosuccinate, methylbenzene sulphonate and ethylbenzene sulphonate.

As a cationic surfactant, it is, for example, possible to use tetrabutylammonium chloride, tetradecylammonium chloride, tetradecyltrimethyl-ammonium bromide (TTAB), alkylpyridinium halides bearing an aliphatic chain and alkylammonium halides.

As a zwitterionic surfactant, it is possible to use sodium N,N-dimethyldodecylammonium butanate, sodium dimethyldodecylammonium propanate and amino acids.

As an amphoteric surfactant, it is possible to use disodium lauroamphodiacetate, betaines such as alkyl amidopropyl betaine or lauryl hydroxyl sulphobetaine.

As a non-ionic surfactant, it is possible to use polyethers, for instance polyethoxylated surfactants such as, for example, polyethylene glycol lauryl ether (POE23 or Brij® 35), polyols (surfactants derived from sugars), in particular glucose alkylates such as, for example, glucose hexanate.

Among the preferred surfactants according to the invention, mention may be made of anionic surfactants such as sulphonates, quaternary ammoniums and non-ionic surfactants such as polyoxyethylenes.

According to another embodiment of the invention, it is possible to use ultrasounds in order to promote the solubilization of the monomer or to form a dispersion when the monomer is insoluble in the liquid solution [R. Asami et al. Langmuir B, 2006, in press].

According to the arrangements presented, the solubility of the monomer proves not to be an obstacle to the implementation of the process due to the use of technical means, such as vigorous stirring, especially induced by ultrasounds, which enable the formation of a dispersion and/or of an emulsion, for the liquid monomer(s). In the case of polymerizable monomer(s) not having an affinity for the liquid solution used, such as non-water-soluble monomers in water, it is therefore advantageous for the solution to be in the form of an emulsion or of a dispersion.

In one variant, the process according to the present invention comprises a prior step during which the polymerizable monomer or the mixture of polymerizable monomers is dispersed or emulsified in the presence of at least one surfactant or by the action of ultrasounds, before it is mixed with the liquid solution comprising at least one adhesion primer.

Within the meaning of the present invention, the expression "organic film" is understood to mean any film of organic nature resulting from several units of organic chemical species, bonded covalently to the surface of the support on which the process that is the subject of the invention is carried out. These are particularly films bonded covalently to the surface of a support and comprising at least one layer of structural units of similar nature, depending on the thickness of the film, its cohesion being provided by the covalent bonds that develop between the various units.

The organic film obtained according to the process of the invention may be solely constituted of units derived from the adhesion primer, in the case where the liquid solution contains no other element capable of polymerizing via a radical route.

When the liquid solution contains, in addition to the adhesion primer, at least one radical-polymerizable monomer different from said adhesion primer, the organic film obtained according to the process of the invention may also be a polymer or copolymer, resulting from several monomer units of identical or different chemical species and/or molecules of adhesion primer. The films obtained by the process of the present invention are "essentially" of the polymer type insofar as the film also incorporates species from the adhesion primer and not solely from the monomers present. An organic film in this particular embodiment is thus, in particular, a film prepared from at least one type of adhesion primer, or from at least one type of polymerizable, particularly radical-polymerizable, monomer and from at least one type of adhesion primer. Advantageously, the organic film within the context of the invention has a sequence of monomer units in which the first unit is constituted by a derivative of the adhesion primer, the other units being derived from either adhesion primers or polymerizable monomers.

The liquid solution containing at least one adhesion primer used within the context of the present invention may also contain a solvent. Thus, everything that was defined previously with respect to the liquid solution (such as the solubility of the adhesion primer and the solubility of the monomer) applies mutatis mutandis to the liquid solution containing at least one solvent. It is preferable for the solvent used to be a protic solvent. The expression "protic solvent" is understood, within the context of the present invention, to mean a solvent which comprises at least one hydrogen atom capable of being released in the form of a proton.

The protic solvent is advantageously chosen from the group constituted by water, acetic acid, hydroxylated solvents such as methanol and ethanol, liquid glycols of low molecular weight such as ethylene glycol, and mixtures thereof. According to one particular embodiment of the invention, a pure protic solvent may be used as a mixture with an aprotic solvent, it being understood that the resulting mixture has the characteristics of a protic solvent and will be therefore considered as such.

The liquid solution containing at least one adhesion primer used within the context of the present invention may also contain at least one support electrolyte. Said support electrolyte may especially be chosen from quaternary ammonium salts such as perchlorates, tosylates, tetrafluoroborates, hexafluorophosphates, short-chain quaternary ammonium halides, sodium nitrate and sodium chloride.

Among these quaternary ammonium salts, mention may, in particular, be made, by way of example, of tetraethylammonium perchlorate (TEAP), tetrabutylammonium perchlorate (TBAP), tetrapropylammonium perchlorate (TPAP), and benzyltrimethylammonium perchlorate (BTMAP).

During step (ii) of the process of the present invention, the polarization is carried out to an electric potential that is more cathodic than the reduction potential of the adhesion primer used. According to the invention, it is preferable for the potential used in step (ii) to be close to the reduction potential of the adhesion primer used and which reacts at the surface. Thus, the value of the potential used during step (ii) of the process according to the invention may be up to 50% higher than the reduction potential of the adhesion primer, more typically it will not be above 30%.

The polarization of the surface may be carried out by any technique known by the one skilled in the art and especially under linear or cyclic voltammetry conditions, under potentiostatic, potentiodynamic, intensiostatic, galvanostatic or galvanodynamic conditions or by simple or pulse chronoamperometry. Advantageously, the process according to the present invention is carried out under cyclic voltammetry conditions. In this case, the number of cycles will be, preferably, between 1 and 10 and, more preferably still, between 1 and 5. According to the invention, it is preferred that, during a potential scan, the range of potential scanned is between the equilibrium potential of the liquid solution as defined previously and between a value at most 50% above the value of the reduction potential of the primer, and typically not more than 30% above this value.

The process according to the present invention may thus especially be carried out in an electrolytic cell comprising three electrodes: a first working electrode constituting the surface intended to receive the film, a counter electrode and also a reference electrode.

During step (iii) of the process according to the present invention, the light radiation is typically chosen so that the exposure of the substrate to said radiation results in an increase of its conductivity. Its wavelength will therefore have to be low enough, i.e. its energy is at least equal to that of the band gap of the semiconductor, so that the charge carriers of the semiconductor substrate can be excited to the conduction band.

It is preferable for the adhesion primer and the monomers optionally present to retain their integrity when they are exposed to the light radiation. Therefore, it is advantageous for their absorbance, for the wavelengths corresponding to those of the light radiation, to be as low as possible.

The radiation used may be focused, for example using an optical lens, on the selected zone of the surface. It is possible to use various sources of radiation. The radiation may be monochromatic or polychromatic. Advantageously, the radiation used in step (iii) of the process according to the invention is filtered monochromatic or filtered polychromatic radiation.

Typically, the intensity of the radiation is at least equal to 2 $mW \cdot cm^{-2}$ and is not greater than 45 $mW \cdot cm^{-2}$. The main wavelength is adapted as a function of the band gap associated with the semiconductor; the value of the band gap for any doped or undoped semiconductor is a value that is readily available to the one skilled in the art. Thus, for example, if the substrate is constituted of silicon, the energy of the radiation must be at least equal to 1.12 eV (value of the band gap in the case of silicon) which means that the wavelength must be less than or equal to 1.1 µm (X. G. Zhang, Electrochemistry of silicon and its oxide, Kluwer Academic/Plenum Publishers, 2001). Thus, the visible radiation of white light type, from, for example, a 100 W halogen lamp may be used. The value of the band gap for various semiconductors (CRC Handbook of Chemistry and Physics, David R. Lide Ed, CRC Press, Boca Raton) and also various measurement methods are illustrated in the literature (D. Gal et al., *Journal of Applied Physics*, 86, 10, 5573-5577).

It is recommended to filter the white light for the wavelengths at which the adhesion primer or the optional monomers are not stable. Thus, for example, it is desirable not to use a wavelength below 550 nm for cleavable aryl salts. Typically, if the radiation is supplied by a source of white light, the latter is filtered at 590 nm.

The electrografting is carried out selectively on the selected zone. Within the meaning of the present invention, a grafting is said to be "selective" when the ratio between the amount of film grafted under selective conditions and between the amount of film grafted under standard electrochemical conditions is greater than 1. Typically, such a ratio will be greater than 10 and more generally greater than 20.

The exposure time to the light radiation used during step (iii) of the process of the invention is a function of the application duration of the potential. It is preferable for steps (ii) and (iii) to be carried out simultaneously. It is thus recommended to expose the surface to the light radiation during the application of the electric potential, advantageously for a time corresponding to that of the electroreduction. Thus, the exposure time generally varies from around ten seconds to one hour.

According to one particular embodiment, only the selected zone of the surface of the substrate is exposed to a light radiation. It is therefore recommended to use, in step (iii) of the process according to the present invention, a mask that is impermeable to the radiation used, opposite the surface of the substrate or in the vicinity of the latter. Such a mask generally corresponds to an external component placed in order to obscure a portion of the light radiation. The contours of the hole in the mask are typically homothetic to the contours of the zone of the surface which has been selected.

In one particular embodiment, only one portion of the surface of the substrate is polarized. This embodiment may be obtained by using a non-homogeneous semiconductor substrate having at least one doped portion and at least one undoped portion. Typically, the use of dopants makes it possible to modify the local properties of the substrate and to polarize only the doped portion. Under these conditions, the organic film will be obtained only on the polarized portion and selectively on a selected zone, exposed to a radiation, of said portion.

The invention also relates to a surface capable of being obtained by the process according to the present invention.

The surfaces obtained in accordance with the present invention may be used in any type of industry and especially in the electronics and microelectronics industries (for example for the preparation of microelectronic components), for the preparation of biomedical devices such as for example devices that can be implanted in the body (stents, for example), screening kits, etc.

The invention can also be applied on various scales, both in microscale and nanoscale electrochemical technology systems (EMST for "Electrochemical Micro- and Nano-System Technologies") and on a scale that is visible to the naked eye for surface coatings of various types.

Another subject of the invention is a process for the enhancement of the electrografting of cleavable aryldiazonium salts onto at least one portion of the surface of a semiconductor in contact with a solution comprising said salts. Such a process may be carried out according to the preceding arrangements and may especially be carried out by exposure of one zone of the surface of the semiconductor substrate on which the grafting must be carried out, to a light radiation, the energy of which is at least equal to that of the band gap of the semiconductor.

Other features and advantages of the present invention will again become visible to a person skilled in the art on reading the examples below, given by way of illustration and non-limitingly, and with reference to the appended figures.

DETAILED DESCRIPTION OF PARTICULAR EMBODIMENTS

I. Material and Methods

I.1. Small Wafers

The examples presented below were carried out starting from silicon wafers obtained from ACM (France). These wafers were cleaned via a treatment with solvents and an acid treatment in order to remove the possible organic pollutants present on the surfaces.

Small rectangular wafers of 5×30 mm were cut from silicon wafers and used in the process. Three types of small wafers are distinguished depending on the p-type doping (with boron as particles per $cm^{-3}$) which is high ($1.5 \times 10^{18}$ $cm^{-3}$, Si-p++), average ($2.1 \times 10^{17}$ $cm^{-3}$, Si-p+) or low ($1.5 \times 10^{15}$ $cm^{-3}$, Si-p).

A layer of gold (placed on a sublayer of chromium) was then evaporated on the rear face of the small wafers in order to establish an electrical contact and provide on ohmic contact (eutectic method with a layer of InGa).

I.2. Adhesion Primer Solution

In order to implement the process according to the invention, a solution of 4-nitrobenzenediazonium tetrafluoroborate was prepared ($2 \times 10^{-3}$ M in 0.2 M $H_2SO_4$).

I.3. Process According to the Invention

Figure 1:
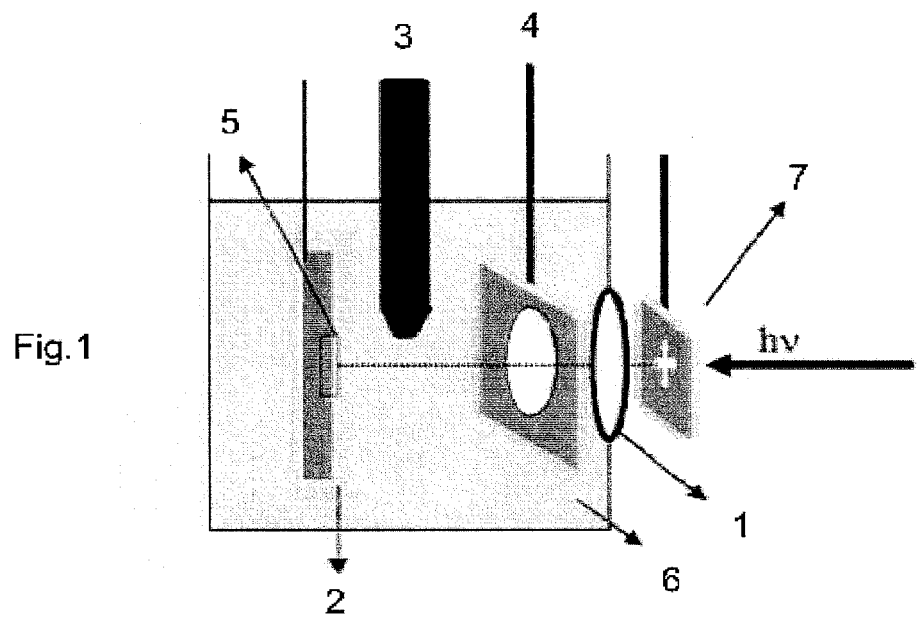
FIG. 1 represents an electrolytic cell that can be used within the context of the invention.

The process was carried out in an electrolytic cell made of polypropylene which does not allow white light to pass through (FIG. 1), one of the faces of which comprised a portion made of glass (1) in order to allow the light radiation to pass through.

The surface of the small wafers in contact with the solution was delimited by an adhesive film (2) and the electrolysis carried out using a standard three-electrode device: a reference electrode (3) ($Hg^{++/Hg}$, $10^{-2}$ M $HgSO_4$ in saturated $K_2SO_4$), counter electrode (4) (5 $cm^2$ platinum electrode) and active electrode (5) corresponding to the wafer of silicon as prepared, in which the solution prepared (6) was placed. The potential values presented below are given as a function of the reference electrode ($Hg/HgSO_4$-MSE).

The irradiations were carried out using a filtered polychromatic source (white light) so that the wavelength was >590 nm, the power was set at 3 $mW \cdot cm^{-2}$ (Fiber Optic Illuminator 77501, Oriel). In order to focus the radiation and to reduce the reflection in the cell, an optical lens was added to the device.

The potential was applied using an EG&G PAR (273A) potentiostat via linear/cyclic voltammetry. Potential scans over a range between +50% and −50% relative to the reduction threshold of the diazonium salt were carried out. More specifically, the scans were carried out between −0.4 V, which corresponds to the equilibrium value of the system, and 1.2 V with respect to the reference, the reduction potential of the diazonium being located at −0.8 V with respect to the reference.

II. Results

II.1. Pre-Checks a. Grafting checks

The location of the zones on which an organic film was grafted was checked by X-ray spectrophotometry (X-ray photoelectron spectroscopy—XPS). The grafted nitrobenzene has particular spectral characteristics (N 1 s band with a characteristic peak at 406 eV which corresponds to the nitro group) which may be used in order to determine not only the presence of an organic film but also the growth of the latter on the surface.

b. Non-Alteration of the Adhesion Primer and of the Film Following Exposure to Radiation Firstly, it was checked that the adhesion primer was not impaired during the exposure to the radiation used. Absorbance measurements made it possible to determine that, for the radiation used, the value of the absorbance of the diazonium salt used is asymptotically close to zero.

It was also checked that a film grafted by simple application of an electrochemical process, as proposed by International application WO 03/018212, was not impaired by exposure to this radiation. After an exposure of 2 h, the XPS spectrum obtained had not varied.

c. Specificity of the Grafting

In order to obtain more reliable measurements, it was also checked that wafers, placed in the solution, in the absence of an electric potential, did not make it possible to consequently graft an organic film both in the presence of radiation and in the absence of radiation.

II.2. Grafting of the Film onto Wafers of Doped Silicon

Summarized in Table 1 are the results which were obtained for the small Si-p++ wafers under the various conditions, i.e. in the presence (radiation) and in the absence of radiation (darkness). The value attributed to each of the experiments corresponds to the percentage that the N is band determined on the XPS spectrum represents.

TABLE 1

| Si-p++ | Darkness (11 h) | Radiation (5 h) | Darkness, cyclic voltammetry, 30 scans, 1 h | Radiation, cyclic voltammetry, 30 scans, 1 h |
|---|---|---|---|---|
| N 1s (XPS) | 0.3 | 0.1 | 0.3 | 6.7 |

The results obtained for various small silicon wafers, as a function of the type of doping, are presented in Table 2 below.

TABLE 2

| | N 1s (XPS) |
|---|---|
| Si-p++ | 6.7 |
| Si-p+ | 7.0 |
| Si-p | 9.6 |

It should be observed that the use of radiation makes it possible to enhance the electrografting since a substantial increase in the N 1 s band is observed.

Moreover, it is also possible to adjust the enhancement by modifying the doping of the substrate, the variations are significant as indicated by the results from Table 2. The enhancement of the grafting is such that the amount of film grafted is between 22 and 32 times the amount grafted under standard conditions.

Furthermore, the film obtained under illumination has the same XPS spectroscopic characteristics as that obtained under the same potential conditions in the dark.

II.3. Use of a Mask

Figure 2:
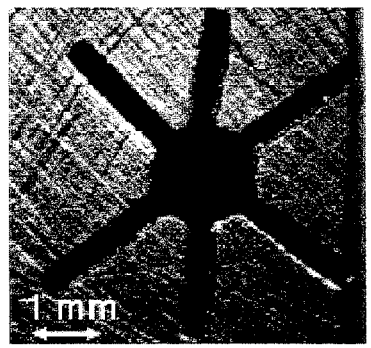
FIG. 2 corresponds to a mask that makes it possible to selectively expose a selected zone.

In order to illustrate the invention even further, a metallic mask (7), represented schematically in FIG. 2, was added to the device used previously.

Figure 3:
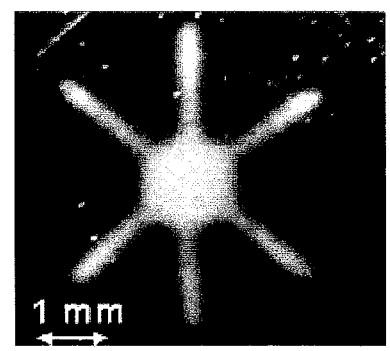
FIG. 3 corresponds to the surface of a substrate, of which one zone has been exposed selectively to light radiation by virtue of the mask represented in FIG. 1.

Under the aforementioned conditions, it was possible to prepare a substrate covered with a homothetic pattern of the hole of the mask (FIG. 3).

The invention claimed is:

1. A method for preparing an organic film on a selected zone at the surface of a photosensitive semiconductor substrate, the method comprising:
   i) bringing a liquid solution comprising at least one organic adhesion primer into contact with at least said selected zone;
   ii) polarizing the surface of said substrate to an electric potential more cathodic than a reduction potential of said at least one organic adhesion primer used in step (i); and
   iii) exposing said selected zone to light radiation, energy of which is at least equal to that of a band gap of said photosensitive semiconductor substrate.

2. The method according to claim 1,
wherein said photosensitive semiconductor substrate is chosen from the group comprising elements from group IV, alloys of elements from group IV, alloys of elements from group III and from group V, and alloys of elements from group II and from group VI.

3. The method according to claim 1,
wherein said photosensitive semiconductor substrate is doped by one or more dopants.

4. The method according to claim 1,
wherein said photosensitive semiconductor substrate is placed in contact with and is partly covered by a conductive material.

5. The method according to claim 4,
wherein the portion of said photosensitive semiconductor substrate covered by said conductive material is located on a rear face of said photosensitive semiconductor substrate.

6. The method according to claim 1,
wherein said at least one organic adhesion primer is a cleavable aryl salt chosen from among the group comprising aryldiazonium salts, arylammonium salts, arylphosphonium salts, and arylsulphonium salts.

7. The method according to claim 1,
wherein said adhesion primer is a cleavable aryl salt of formula $R-N_2^+, A^-$,
wherein $A^-$ represents a monovalent anion, and R represents an aryl group.

8. The method according to claim 7,
wherein said aryl group is chosen from monosubstituted or polysubstituted, aromatic or heteroaromatic carbon-based structures having one or more aromatic or heteroaromatic rings each comprising from 3 to 8 atoms, heteroatoms of which comprise N, O, P or S, and substituents of which containing one or more of said heteroatoms or $C_1$ to $C_6$ alkyl groups.

9. The method according to claim 7,
wherein said aryl group is chosen from monosubstituted or polysubstituted, aromatic or heteroaromatic carbon-based structures having one or more aromatic or heteroaromatic rings each comprising from 3 to 8 atoms, heteroatoms of which comprise N, O, P or S, and substituents of which containing one or more of said heteroatoms or $C_1$ to $C_6$ alkyl groups.

10. The method according to claim 7,
wherein $A^-$ is chosen from among inorganic anions, haloborates and organic anions.

11. The method according to claim 7,
wherein the compound of formula $R-N_2^+, A^-$ is chosen from among the group consisting of phenyldiazonium tetrafluoroborate, 4-nitrophenyldiazonium tetrafluoroborate, 4-bromophenyldiazonium tetrafluoroborate, 4-aminophenyldiazonium chloride, 2-methyl-4-chlorophenyldiazonium chloride, 4-benzoylbenzenediazonium tetrafluoroborate, 4-cyanophenyldiazonium tetrafluoroborate, 4-carboxyphenyldiazonium tetrafluoroborate, 4-acetamidophenyldiazonium tetrafluoroborate, 4-phenylacetic acid diazonium tetrafluoroborate, 2-methyl-4-[(2-methylphenyl)diazenyl]benzenediazonium sulphate, 9,10-dioxo-9,10-dihydro-1-anthracenediazonium chloride, 4-nitro-naphthalenediazonium tetrafluoroborate, and naphthalenediazonium tetrafluoroborate.

12. The method according to claim 1,
wherein a concentration of adhesion primer in said liquid solution is between $10^{-3}$ and $5 \times 10^{-2}$ M, said adhesion primer being an aryldiazonium salt.

13. The method according to claim 1,
wherein said adhesion primer is either introduced as is into said liquid solution, or is prepared in situ in said liquid solution.

14. The method according to claim 1,
wherein said liquid solution also contains at least one radical-polymerizable monomer different from said adhesion primer.

15. The method according to claim 14,
wherein said radical-polymerizable monomer is a molecule comprising at least one ethylenic-type bond.

16. The method according to claim 15,
wherein said radical-polymerizable monomer is a monomer of formula (II) below:

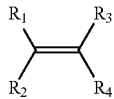

(II)

in which the $R_1$ to $R_4$ groups are identical or different and represent a non-metallic monovalent atom comprising a halogen atom, a hydrogen atom, a saturated or unsaturated chemical group comprising an alkyl or aryl group, a —$COOR_5$ group in which $R_5$ represents a hydrogen atom or a $C_1$-$C_{12}$ alkyl group, a nitrile, a carbonyl, an amine, or an amide.

17. The method according to claim 16,
wherein, in said —$COOR_5$ group, said $R_5$ represents a $C_1$-$C_6$, alkyl group.

18. The method according to claim 14, wherein said radical-polymerizable monomer is chosen from among the group consisting of vinyl acetate, acrylonitrile, methacrylonitrile, methyl methacrylate, ethyl methacrylate, butyl methacrylate, propyl methacrylate, hydroxyethyl methacrylate, hydroxypropyl methacrylate, glycidyl methacrylate and derivatives thereof; acrylamides, amino-ethyl, propyl, butyl, pentyl and hexyl methacrylamides, cyanoacrylates, diacrylates and dimethacrylates, triacrylates and trimethacrylates, tetraacrylates and tetramethacrylates, pentaerythritol tetramethacrylate, styrene and its derivatives, para-chlorostyrene, pentafluorostyrene, N-vinylpyrrolidone, 4-vinylpyridine, 2-vinylpyridine, vinyl, acryloyl or methacryloyl halides, divinylbenzene (DVB); and vinyl crosslinking agents or crosslinking agents based on acrylate, methacrylate, and derivatives thereof.

19. The method according to claim 14,
wherein an amount of said radical-polymerizable monomer represents from 18 to 40 times the solubility of said monomer in said liquid solution at ambient temperature or at the reaction temperature.

20. The method according to claim 14, further comprising:
dispersing or emulsifying said polymerizable monomer in the presence of at least one surfactant or via ultrasound action, before said polymerizable monomer is mixed with the liquid solution comprising at least one adhesion primer.

21. The method according to claim 1,
wherein said liquid solution further contains a solvent.

22. The method according to claim 21, wherein said solvent is a protic solvent chosen from among the group consisting of water, acetic acid, a hydroxylated solvent, a liquid glycol of low molecular weight, and mixtures thereof.

23. The method according to claim 22,
wherein said hydroxylated solvent is methanol or ethanol, and
wherein said liquid glycol of low molecular weight is ethylene glycol.

24. The method according to claim 1,
wherein said liquid solution further contains at least one support electrolyte.

25. The method according to claim 1,
wherein said electric potential in step (ii) is substantially the same as the reduction potential of said adhesion primer.

26. The method according to claim 1, wherein said electric potential in step (ii) is up to 50% higher than the reduction potential of the adhesion primer.

27. The method according to claim 1,
wherein said polarization of step (ii) is carried out under cyclic voltammetry conditions.

28. The method according to claim 27, wherein a number of cycles of the cyclic voltammetry conditions is between 1 and 10 and a range of electric potential scanned is between an equilibrium potential of a liquid solution comprising at least one organic adhesion primer and between a value no more than 50% greater than the value of the reduction potential of the at least one organic adhesion primer.

29. The method according to claim 1,
wherein said light radiation in step (iii) is focused on said selected zone.

30. The method according to claim 1,
wherein said light radiation in step (iii) is filtered monochromatic or filtered polychromatic light radiation.

31. The method according to claim 1,
wherein the intensity of said light radiation in step (iii) is at least equal to 2 $mW \cdot cm^{-2}$ and is not greater than 45 $mW \cdot cm^{-2}$.

32. The method according to claim 1, wherein a mask impermeable to the light radiation is used in step (iii) opposite said substrate surface of in the vicinity of said substrate surface.

* * * * *